(12) United States Patent
Onishi et al.

(10) Patent No.: US 7,659,592 B2
(45) Date of Patent: Feb. 9, 2010

(54) OPTICAL ELEMENT, OPTICAL MODULE AND METHOD FOR MANUFACTURING THE SAME

(75) Inventors: Hajime Onishi, Chino (JP); Masamitsu Mochizuki, Chino (JP)

(73) Assignee: Seiko Epson Corporation (JP)

( * ) Notice: Subject to any disclaimer, the term of this patent is extended or adjusted under 35 U.S.C. 154(b) by 538 days.

(21) Appl. No.: 11/457,558

(22) Filed: Jul. 14, 2006

(65) Prior Publication Data
US 2007/0015298 A1    Jan. 18, 2007

(30) Foreign Application Priority Data
Jul. 15, 2005   (JP) .............................. 2005-206662

(51) Int. Cl.
*H01L 23/48*   (2006.01)
*H01S 5/026*   (2006.01)

(52) U.S. Cl. ............... 257/432; 257/444; 257/E33.072; 372/50.21

(58) Field of Classification Search ................. 257/432, 257/444, E33.072; 372/FOR. 109, 29.011, 372/29.013, 38.01, 50.21; 438/24
See application file for complete search history.

(56) References Cited

U.S. PATENT DOCUMENTS

| 5,757,837 | A | * | 5/1998 | Lim et al. | ................. | 372/50.21 |
| 5,887,013 | A |   | 3/1999 | Lee |   |   |
| 6,753,214 | B1 | * | 6/2004 | Brinkmann et al. | ......... | 438/184 |
| 7,242,704 | B2 | * | 7/2007 | Kaneko | ................... | 372/50.21 |
| 7,289,547 | B2 | * | 10/2007 | Trezza et al. | ............. | 372/50.21 |

FOREIGN PATENT DOCUMENTS

| JP | 10-135568 | 5/1998 |
| JP | 2002-184787 | 6/2002 |

\* cited by examiner

*Primary Examiner*—George Fourson
(74) *Attorney, Agent, or Firm*—Harness, Dickey & Pierce, P.L.C.

(57) ABSTRACT

A method for manufacturing an optical element having a surface-emitting type semiconductor laser and a photodetector element that detects light emitted from the surface-emitting type semiconductor laser, the method including the steps of: (a) laminating, above a substrate, semiconductor layers for forming a first mirror, an active layer, a second mirror, a photoabsorption layer, an etching stopper layer and a contact layer; (b) patterning the semiconductor layers to form at least a photoabsorption layer, an etching stopper layer and a contact layer; (c) forming an electrode above the contact layer; and (d) etching a portion of the contact layer until an upper surface of the etching stopper layer is exposed.

6 Claims, 3 Drawing Sheets

OPTICAL ELEMENT, OPTICAL MODULE AND METHOD FOR MANUFACTURING THE SAME

The entire disclosure of Japanese Patent Application No. 2005-206662, filed Jul. 15, 2005 is expressly incorporated by reference herein.

BACKGROUND

1. Technical Field

The present invention relates to optical elements and optical modules.

2. Related Art

A surface-emitting type semiconductor laser has characteristics in which its light output changes depending on the ambient temperature. For this reason, an optical module that uses a surface-emitting type semiconductor laser may be equipped with a photodetector element that detects a part of laser light emitted from the surface-emitting type semiconductor laser to thereby monitor its light output value. Usually, a photodetector element detects light reflected by a reflector plate that is diagonally provided with respect to an emission direction of the surface-emitting type semiconductor laser.

Also, Japanese Laid Open Patent Application JP-A-10-135568 describes an optical element in which a photodetector element is provided on a surface-emitting type semiconductor laser, whereby a part of laser light emitted from the surface-emitting type semiconductor laser can be monitored within the same element. According to the optical element, the reflector plate described above becomes unnecessary, and miniaturization of the optical element and reduction of the alignment cost can be achieved.

However, in such an optical element, the photodetector element may influence the optical characteristics of the surface-emitting type semiconductor laser, and therefore it is desired to control accurately the film thickness of the photodetector element.

SUMMARY

In accordance with an advantage of some aspects of the present invention, there are provided optical elements, methods for manufacturing the same and optical modules, in which the film thickness of a photodetector element implemented therein can be accurately controlled.

A method for manufacturing an optical element in accordance with an embodiment of the invention pertains to a method for manufacturing an optical element having a surface-emitting type semiconductor laser and a photodetector element that detects light emitted from the surface-emitting type semiconductor laser, and the method includes the steps of:

(a) laminating semiconductor layers, above a substrate, for forming a first mirror, an active layer, a second mirror, a photoabsorption layer, an etching stopper layer and a contact layer;

(b) patterning the semiconductor layers to form at least a photoabsorption layer, an etching stopper layer and a contact layer;

(c) forming an electrode above the contact layer; and (d) etching a portion of the contact layer until an upper surface of the etching stopper layer is exposed.

In accordance with the present embodiment, a portion of the contact layer is etched after the electrode has been formed, such that the film thickness of the optical element formed from the etching stopper layer and the photoabsorption layer can be accurately controlled. By this, the impact of the optical element that affects the optical characteristics of the surface-emitting type semiconductor laser can be reduced.

In the description concerning the invention, the word "above" may be used assuming that the word "above," when used in, for example, "forming a specific object (hereafter referred to as "B") 'above' another specific object (hereafter referred to as "A")," includes a case in which B is formed directly on A, and a case in which B is formed over A through another object.

In the method for manufacturing an optical element in accordance with an aspect of the embodiment of the invention, the etching stopper layer may be formed from InGaP, and the contact layer may be formed from InGaAs.

In the method for manufacturing an optical element in accordance with an aspect of the embodiment of the invention, the etching stopper layer may be formed from InGaP, and the contact layer may be formed from GaAs.

In the method for manufacturing an optical element in accordance with an aspect of the embodiment of the invention, the etching stopper layer may be formed from GaAs, and the contact layer may be formed from InGaP.

In the method for manufacturing an optical element in accordance with an aspect of the embodiment of the invention, in the step (d), the contact layer may be etched by using the electrode as a mask.

An optical element in accordance with an embodiment of the invention pertains to an optical element having a surface-emitting type semiconductor laser and a photodetector element that detects light emitted from the surface-emitting type semiconductor laser, wherein:

the surface-emitting type semiconductor laser includes a first mirror formed above a substrate, an active layer formed above the first mirror, and a second mirror formed above the active layer, and the photodetector includes a photoabsorption layer formed above the second mirror, an etching stopper layer formed above the photoabsorption layer, a contact layer formed above a portion of the etching stopper layer, and an electrode formed above the contact layer.

In the optical element in accordance with an aspect of the embodiment of the invention, the etching stopper layer may be composed of InGaP, and the contact layer may be composed of InGaAs.

In the optical element in accordance with an aspect of the embodiment of the invention, the etching stopper layer may be composed of InGaP, and the contact layer may be composed of GaAs.

In the optical element in accordance with an aspect of the embodiment of the invention, the etching stopper layer may be composed of GaAs, and the contact layer may be composed of InGaP.

An optical module in accordance with an embodiment of the invention includes:

an optical element having a surface-emitting type semiconductor laser and a photodetector element that detects light emitted from the surface-emitting type semiconductor laser, and a light-receiving element that receives light from outside, wherein the surface-emitting type semiconductor laser includes a first mirror formed above a substrate, an active layer formed above the first mirror, and a second mirror formed above the active layer, the photodetector element includes a first photoabsorption layer formed above the second mirror, an etching stopper layer formed above the photoabsorption layer, a contact layer formed above a portion of the etching stopper layer, and an electrode formed above the contact layer, and the light-receiving element includes a second photoabsorption layer and an electrode.

In the optical module in accordance with an aspect of the embodiment of the invention, the first photoabsorption layer may have a film thickness that is smaller than a film thickness of the second photoabsorption layer.

DESCRIPTION OF EXEMPLARY EMBODIMENTS

Preferred embodiments of the invention are described below with reference to the accompanying drawings.

1. Structure of Optical Element

Figure 1:
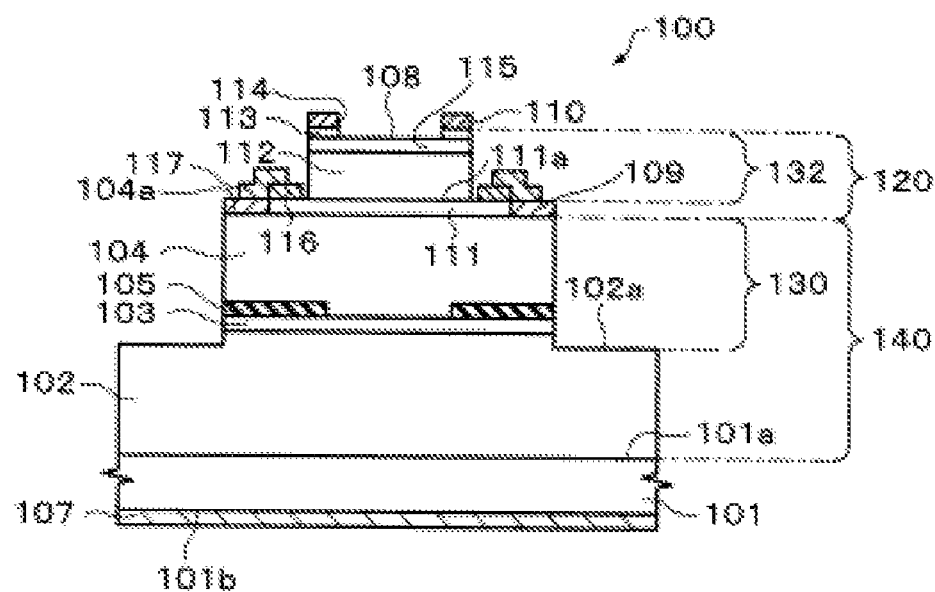
FIG. 1 schematically shows a cross-sectional view of an optical element in accordance with an embodiment of the invention.
Figure 2:
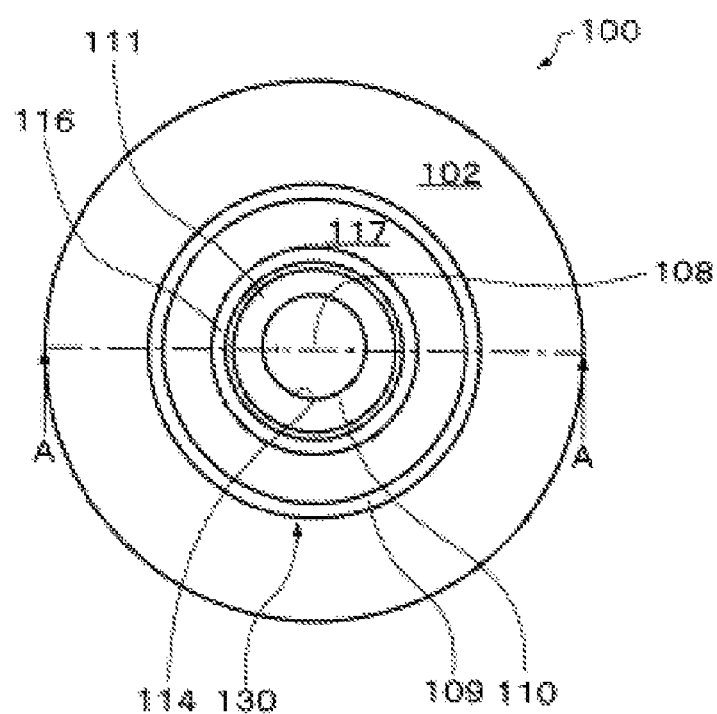
FIG. 2 schematically shows a plan view of the optical element in accordance with the embodiment of the invention.

FIG. 1 schematically shows a cross-sectional view of an optical element 100 in accordance with an embodiment of the present invention. Also, FIG. 2 schematically shows a plan view of the optical element 100 shown in FIG. 1. It is noted that FIG. 1 is a view showing a cross section taken along a line A-A in FIG. 2.

The optical element 100 in accordance with the present embodiment includes, as shown in FIG. 1 and FIG. 2, a surface-emitting type semiconductor laser 140 and a photodetector section 120. The present embodiment is described as to a case where the photodetector element 120 functions as a pin type photodiode. The surface-emitting type semiconductor laser 140, the photodetector element 120 and the overall structure of the optical element 100 are described below.

1.1. Surface-Emitting Type Semiconductor Laser

The surface-emitting type semiconductor laser 140 is provided on a semiconductor substrate 101. For example, an n-type GaAs substrate may be used as the semiconductor substrate 101. The surface-emitting type semiconductor laser 140 has a vertical resonator. Also, the surface-emitting type semiconductor laser 140 may include a columnar semiconductor deposited body (hereafter referred to as a "first columnar section") 130.

The surface-emitting type semiconductor laser 140 is formed from, for example, a distributed reflection type multilayer mirror (hereafter referred to as a "first mirror") 102 of 38.5 pairs of alternately laminated n-type $Al_{0.9}Ga_{0.1}As$ layers and n-type $Al_{0.1}Ga_{0.7}As$ layers, an active layer 103 that is composed of GaAs well layers and $Al_{0.3}Ga_{0.7}As$ barrier layers in which the well layers include a quantum well structure composed of three layers, and a distributed reflection type multilayer mirror (hereafter referred to as a "second mirror") 104 of 24 pairs of alternately laminated p-type $Al_{0.9}Ga_{0.1}As$ layers and p-type $Al_{0.1}Ga_{0.9}As$ layers, which are successively laminated. It is noted that the composition of each layer and the number of layers composing the first mirror 102, the active layer 103 and the second mirror 104 may not be particularly limited to the above.

The second mirror 104 is made to be p-type by doping, for example, carbon (C), and the first mirror 102 is made to be n-type by doping, for example, silicon (Si). Accordingly, a pin diode is formed with the p-type second mirror 104, the active layer 103 in which no impurity is doped, and the n-type first mirror 102.

In the surface-emitting type semiconductor laser 140, a portion thereof extending from the second mirror 104 to a certain point of the first mirror 102 is etched in a circular shape as viewed from an upper surface 104a of the second mirror 104, whereby a first columnar section 130 is formed. It is noted that the plane configuration of the first columnar section 130, in accordance with the present embodiment, is circular, but the configuration thereof can be in any arbitrary shape.

Further, a current constricting layer 105, which is obtained by oxidizing a layer of Al Ga As from its side surface in a region near the active layer 103 among the layers composing the second mirror 104, is formed. The current constricting layer 105 is formed in a ring shape. In other words, the current constricting layer 105 has a cross-sectional configuration which, when cut in a plane parallel with the surface 101a of the semiconductor substrate 101 shown in FIG. 1 and FIG. 2, is in a ring shape defined by circles concentric with the circular shape of the plane configuration of the first columnar section 130.

Also, the surface-emitting type semiconductor laser 140 is provided with a first electrode 107 and a second electrode 109. The first electrode 107 and the second electrode 109 are used for driving the surface-emitting type semiconductor laser 140. Concretely, as shown in FIG. 1, the first electrode 107 is provided on a back surface 101b of the semiconductor substrate 101. The second electrode 109 is provided on an upper surface 104a of the second mirror 104. The second electrode 109 has a plane configuration that is a ring shape. In other words, the second electrode 109 is provided in a manner to surround a first contact layer 111 to be described below. Stated otherwise, the first contact layer 111 is provided inside the second electrode 109. The second electrode 109 and a third electrode 116 to be described below are connected to each other with a connection electrode 117. Concretely, the connection electrode 117 is connected to the upper surface of the second electrode 109, and is in contact with the upper surface and side surface of the third electrode 116.

It is noted that, in the present embodiment, a case where the first electrode 107 is provided on the back surface 101b of the semiconductor substrate 101 is indicated, but the first electrode 107 may be provided on the upper surface 102a of the first mirror 102.

The first electrode 107 may be composed of a film of layers of, for example, an alloy of gold (Au) and germanium (Ge), nickel (Ni) and gold (Au) successively laminated in this order. The second electrode 109 is composed of a film of layers of, for example, titanium (Ti), platinum (Pt) and gold (Au) successively laminated in this order.

An electric current is injected in the active layer 103 by the first electrode 107 and the second electrode 109. It is noted that the materials for composing the first electrode 107 and the second electrode 109 are not limited to those described above, and, for example, a film of laminated layers of platinum (Pt), titanium (Ti), platinum (Pt) and gold (Au) may be used. As the connection electrode 117, for example, a film of laminated layers of chrome (Cr) and gold (Au) may be used, but any other known metal, alloy or a film of laminated layers of the aforementioned materials may also be used without any particular limitation.

1.2. Photodetector Element

The photodetector element 120 is provided on the surface-emitting type semiconductor laser 140. Concretely, the photodetector element 120 is provided on the second mirror 104. In the optical element 100 in accordance with the present embodiment, the upper surface of the photodetector element 120 includes a laser light emission-incidence surface 108. Also, the optical element 120 may include a columnar semiconductor deposited body (hereafter referred to as a "second columnar section") 132.

Furthermore, the photodetector element 120 includes a first contact layer 111, a photoabsorption layer 112, an etching stopper layer 115 and a second contact layer 113. The first contact layer 111 is provided on the second mirror 104, the photoabsorption layer 112 is provided on the first contact layer 111, the etching stopper layer 115 is provided on the photoabsorption layer 112, and the second contact layer 113 is provided on the etching stopper layer 115. The second contact layer 113, the etching stopper layer 115 and the photoabsorption layer 112 compose the second columnar section 132. Each of the first contact layer 111 and the second columnar section 132 may have a plane configuration that is a circular shape.

The first contact layer 111 is composed of, for example, an n-type GaAs layer, and the photoabsorption layer 112 is composed of, for example, a GaAs layer in which no impurity is doped. Concretely, the first contact layer 111 is made to be n-type by doping, for example, silicon (Si).

As the etching stopper layer 115, materials with which etching can be stopped at an upper surface of the etching stopper layer 115 in the step of etching a second contact layer 113 to be described below may be used. For example, the etching stopper layer 115 may be composed of p-type InGaP.

Here, the etching stopper layer 115 and the photoabsorption layer 112 combined may preferably have an optical film thickness that is an odd multiple of $\lambda/4$, where $\lambda$ is a designed wavelength. By this, resonance of light that enters the etching stopper layer 115 and the photoabsorption layer 112 from the surface-emitting type semiconductor laser 140 is suppressed, and an elevation of the threshold value can be suppressed better, compared to cases with other film thicknesses. In this manner, in accordance with the present embodiment, the photodetector element 120 can be accurately formed to a film thickness that is equal to an odd multiple of $\lambda/4$, such that the impact of the photodetector element 120 that may affect the optical characteristics of the surface-emitting type semiconductor laser 140 can be reduced.

It is noted that, in the present embodiment, a designed wavelength is a wavelength of light with the maximum intensity among light generated by a surface-emitting type semiconductor laser. Also, in accordance with the present embodiment, an optical film thickness is a value obtained by multiplying an actual film thickness of a layer by a refractive index of a material composing the layer.

As the second contact layer 113, a layer that is easier to be etched than the etching stopper layer 115 is used in a step of etching the second contact layer 113 to be described later. For example, the second contact layer 113 may be composed of p-type nx $Ga_{1-x}As$. It is noted here that X may preferably be 0.5 or more but 1 or less. By this, in a step for forming a fourth electrode 110 to be described below, ohmic contact between the fourth electrode 110 and the second contact layer 113 can be obtained without conducting a heat treatment. The second contact layer 113 and the etching stopper layer 115 are made to be p-type by doping, for example, carbon (C).

The second contact layer 113 has an aperture section 114. A portion of the upper surface of the etching stopper layer 115 is exposed through the aperture section 114 of the second contact layer 113. In other words, the second contact layer 113 is formed on a portion of the etching stopper layer 115. The exposed portion of the upper surface of the etching stopper layer 115 defines an emission surface 108 for emission of laser light. The aperture section 114 of the second contact layer 113 may have a plane configuration that is the same as the plane configuration of an aperture section 114 of a fourth electrode 110 to be described below. The plane configuration of the aperture section 114 of the second contact layer 113 may be formed in, for example, a circular shape. As viewed in a plan view, the region of the aperture section 114 of the second contact layer 113 may be matched with the region of the aperture section 114 of the fourth electrode 110. Alternatively, as viewed in a plane view, the region of the aperture section 114 of the second contact layer 113 may be made wider than the region of the aperture section 114 of the fourth electrode 110. In other words, the fourth electrode 110 can form an overhang with respect to the second contact layer 113.

A fourth electrode 110 is formed on the second contact layer 113. The fourth electrode 110 has an aperture section 114. Due to the aperture section 114 of the fourth electrode 110, laser light can be emitted outside without being blocked. The aperture section 114 of the fourth electrode 110 has a plane configuration that is, for example, a circular shape.

The photodetector element 120 is provided with the third electrode 116 and the fourth electrode 110. The third electrode 116 and the fourth electrode 110 are used to drive the photodetector element 120. The third electrode 116 is formed on the first contact layer 111, as shown in FIG. 1. The third electrode 116 has a plane configuration that is a ring shape, as shown in FIG. 2. In other words, the third electrode 116 is provided in a manner to surround the photoabsorption layer 112. Stated otherwise, the photoabsorption layer 112 is provided inside the third electrode 116. As described above, the third electrode 116 and the second electrode 109 are connected to each other with the connection electrode 117.

The fourth electrode 110 is provided on the top surface of the photodetector element 120 (on the second contact layer 113), as shown in FIG. 1. The fourth electrode 110 is formed on the top surface of the second contact layer 113, as shown in FIG. 1.

Also, in the optical element 100 in accordance with the present embodiment, the third electrode 116 may be formed with the same material as that of the first electrode 107, and the fourth electrode 110 may be formed with the same material as that of the second electrode 109.

1.3. Overall Structure

In the optical element 100 in accordance with the present embodiment, the n-type first mirror 102 and the p-type second mirror 104 of the surface-emitting type semiconductor laser 140, and the n-type first contact layer 111, the etching stopper layer 115 and the p-type second contact layer 113 of the photodetector element 120 form a npnp structure as a whole.

In the present embodiment, a case where the photodetector element 120 functions as a pin type photodiode is described. However, the invention is also applicable to other types of photodetector elements in addition to pin type photodiodes. It is noted that the photodetector elements to which the invention is applicable include, for example, avalanche type photodiodes, MSM type photodiodes and the like.

2. Operation of Optical Element

General operations of the optical element 100 in accordance with the present embodiment are described below. It is noted that the method for driving the optical element 100 described below is an example, and a variety of changes can be made without departing from the subject matter of the invention.

The photodetector element 120 has a function to monitor outputs of light generated by the surface-emitting type semiconductor laser 140. Concretely, the photodetector element 120 converts light generated by the surface-emitting type semiconductor laser 140 into electric current. With the electric current value, outputs of light generated by the surface-emitting type semiconductor laser 140 can be detected. The aforementioned function is more concretely described below.

When a voltage in a forward direction is applied to the pin diode across the first electrode 107 and the second electrode 109, recombination of electrons and holes occur in the active layer 103 of the surface-emitting type semiconductor laser 140, thereby causing emission of light due to the recombination. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from the upper surface 104a of the second mirror 104, and enters the first contact layer 111 of the photodetector element 120.

Then, in the photodetector element 120, the light that entered the first contact layer 111 then enters the photoabsorption layer 112. As a result of a part of the incident light being absorbed by the photoabsorption layer 112, photoexcitation is caused in the photoabsorption layer 112, and electrons and holes are generated. Then, by an electric field that is applied from an outside element, the electrons move to the third electrode 116 and the holes move to the fourth electrode 110, respectively. As a result, an electric current (photoelectric current) is generated in the direction from the first contact layer 111 to the second contact layer 113 through the etching stopper layer 115 in the photodetector element 120. By measuring the value of the current, light output of the surface-emitting type semiconductor laser 140 can be detected.

Also, light output of the surface-emitting type semiconductor laser 140 is determined mainly by electric current circulating through the surface-emitting type semiconductor laser 140. In particular, light output of the surface-emitting type semiconductor laser 140 greatly changes depending on the ambient temperature of the surface-emitting type semiconductor laser 140 and the service life of the surface-emitting type semiconductor laser 140. For this reason, it is necessary for the surface-emitting type semiconductor laser 140 to maintain a predetermined level of light output.

In the optical element 100 in accordance with the present embodiment, light output of the surface-emitting type semiconductor laser 140 is monitored, and the value of voltage to be applied to the surface-emitting type semiconductor laser 140 is adjusted based on the value of electric current generated by the photodetector element 120, whereby the value of electric current that circulates within the surface-emitting type semiconductor laser 140 can be adjusted. Accordingly, a predetermined level of light output can be maintained in the surface-emitting type semiconductor laser 140. The control to feed back the light output of the surface-emitting type semiconductor laser 140 to the value of a voltage to be applied to the surface-emitting type semiconductor laser 140 can be performed with an external electronic circuit (a driver circuit not shown).

Also, the photodetector element 120 has a function to convert light (i.e., optical signal) that enters the emission-incidence surface 108 from outside of the optical element 100 to electrical current (i.e., electrical signal). Based on the electrical signal, the optical signal from outside of the optical element 100 can be detected.

3. Method for Manufacturing Optical Element

Figure 3:
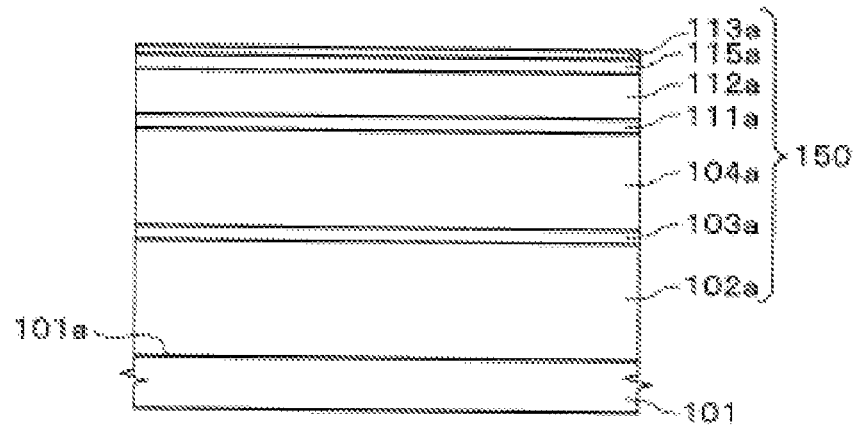
FIG. 3 is a cross-sectional view schematically showing a step of a method for manufacturing an optical element in accordance with an embodiment of the invention.
Figure 4:
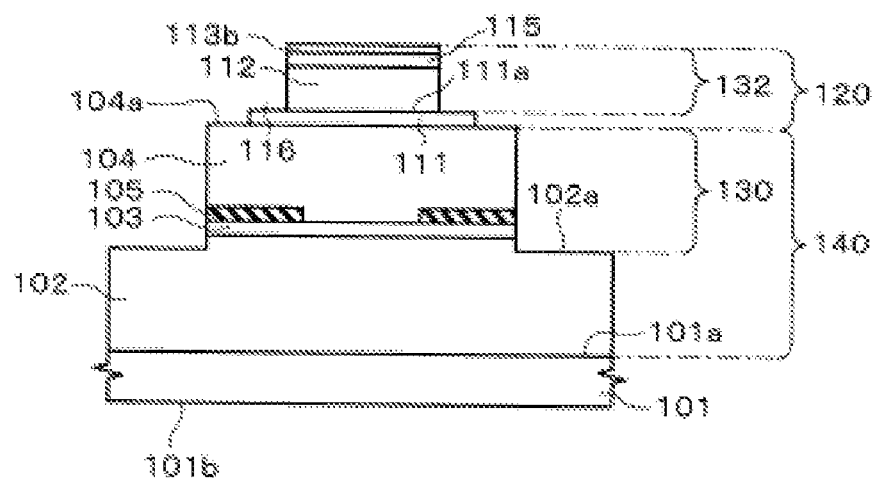
FIG. 4 is a cross-sectional view schematically showing a step of the method for manufacturing an optical element in accordance with an embodiment of the invention.
Figure 5:
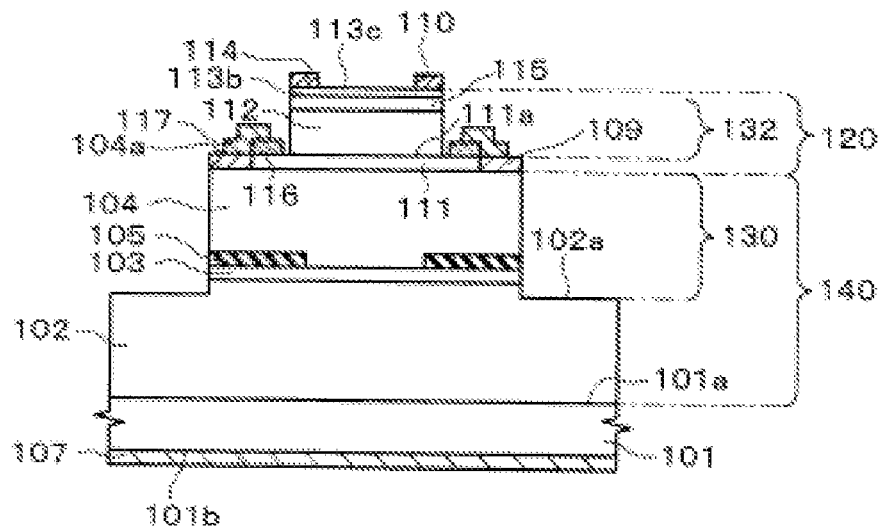
FIG. 5 is a cross-sectional view schematically showing a step of the method for manufacturing an optical element in accordance with an embodiment of the invention.

Next, an example of a method for manufacturing an optical element 100 in accordance with an embodiment of the invention is described with reference to FIG. 3 through FIG. 5. FIG. 3 through FIG. 5 are cross-sectional views schematically showing steps of a method for manufacturing an optical element 100 shown in FIG. 1 and FIG. 2, and correspond to the cross-sectional view shown in FIG. 1, respectively.

(1) First, on a surface 101a of a semiconductor substrate 101 composed of an n-type GaAs layer, a semiconductor multilayer film 150 is formed by epitaxial growth while modifying its composition, as shown in FIG. 3. It is noted here that the semiconductor multilayer film 150 is formed from multiple layers for, for example, a first mirror 102a of 38.5 pairs of alternately laminated n-type $Al_{0.9}Ga_{0.1}As$ layers and n-type $Al_{0.1}Ga_{0.9}As$ layers, an active layer 103a composed of GaAs well layers and $Al_{0.3}Ga_{0.7}As$ barrier layers in which the well layers include a quantum well structure composed of three layers, a second mirror 104a of 24 pairs of alternately laminated p-type $Al_{0.9}Ga_{0.1}As$ layers and p-type $Al_{0.1}Ga_{0.9}As$ layers, a first contact layer 111a composed of an n-type GaAs layer, a photoabsorption layer 112a composed of a GaAs layer in which no impurity is doped, an etching stopper layer 115a composed of a p-type InGaP layer, and a second contact layer 113a composed of a p-type InGaAs layer. These layers are successively laminated on the semiconductor substrate 101, whereby the semiconductor multilayer film 150 is formed.

It is noted that, when the second mirror 104a is grown, at least one layer thereof near the active layer 103a may be formed to be an AlAs layer or an AlGaAs layer that is later oxidized and becomes a current constricting layer 105. The AlGaAs layer that becomes the current constricting layer 105 may have an Al composition that is greater than 0.95, for example. In the present embodiment, the Al composition of the AlGaAs layer means an aluminum composition with respect to III-group elements. The Al composition of the AlGaAs layer may vary from 0 to 1. In other words, the AlGaAs layer includes a GaAs layer (when the Al composition is 0) and an AlAs layer (when the Al composition is 1). Also, the topmost layer of each of the second mirror 104a and the second contact layer 113a may preferably be formed to have a high carrier density, such that they can readily make ohmic contact with electrodes (second electrode 109, fourth electrode 110).

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may preferably be 450° C.-800° C. Also, the time required for conducting the epitaxial growth is appropriately decided like the temperature. Also, a metal-organic vapor phase deposition (i.e., MOVPE: Metal-Organic Vapor Phase Epitaxy) method, a MBE method (Molecular Beam Epitaxy) method, or a LPE (Liquid Phase Epitaxy) method can be used as a method for the epitaxial growth.

(2) Next, the semiconductor multilayer film 150 is patterned by known lithography technique and etching technique. By this, as shown in FIG. 4, a first columnar section 130, a first contact layer 111 and a second columnar section 132 are formed.

In the patterning steps, the sequence in forming the first columnar section 130, the first contact layer 111 and the second contact layer 132 is not particularly limited.

(3) Next, by placing the semiconductor substrate 101 on which the photodetector element 120 and the surface-emitting type semiconductor laser 140 are formed through the aforementioned steps in, for example, a water vapor atmosphere at about 400° C., the aforementioned layer with a high Al composition among the second mirror 104 is oxidized from its side surface, whereby a current constricting layer 105 is formed (see FIG. 4).

The oxidation rate depends on the temperature of the furnace, the amount of water vapor supply, and the Al composition and the film thickness of the layer to be oxidized. In the surface-emitting type semiconductor laser 140 equipped with the current constricting layer 105 that is formed by oxidation, when driven, a current circulates only in a portion where the current constricting layer 105 is not formed (a portion that is not oxidized). Accordingly, in the process for forming the current constricting layer 105 by oxidation, the range of the current constricting layer 105 to be formed may be controlled, whereby the current density can be controlled.

Also, the diameter of a circular portion where the current constricting layer 105 is not formed (i.e., a portion that is not oxidized) may preferably be adjusted such that a major portion of light that is emitted from the surface-emitting type semiconductor laser 140 enters the first contact layer 111.

(6) Next, as shown in FIG. 5, a third electrode 116 is formed on an upper surface 111a of the first contact layer 111. Before forming the third electrode 116, the upper surface 111a of the first contact layer 111 may be washed with a plasma treatment method if necessary. By this, a device with more stable characteristics can be formed.

Next, a laminated film (not shown) of layers of, for example, an alloy of gold (Au) and germanium (Ge), nickel (ni) and gold (Au) is formed by, for example, a vacuum deposition method. Then, portions of the laminated film other than predetermined positions are removed by a known lift-off technique, whereby the third electrode 116 is formed on the first contact layer 111 of the photodetector element 120.

Then, as shown in FIG. 5, a first electrode 107 is formed on a back surface 101b of the semiconductor substrate 101. First, before forming the first electrode 107, the back surface 101b of the semiconductor substrate 101 may be washed by a plasma treatment method, if necessary. By this, a device with more stable characteristics can be formed.

Next, a laminated film (not shown) of layers of, for example, an alloy of gold (Au) and germanium (Ge), nickel (ni) and gold (Au) is formed by, for example, a vacuum deposition method.

Then, an anneal treatment is conducted in, for example, a nitrogen atmosphere. The anneal treatment may be conducted, for example, around 400° C. The anneal treatment may be conducted for, for example, about 3 minutes.

(5) Next, as shown in FIG. 5, a second electrode 109 is formed on an upper surface 104a of the second mirror 104, and a fourth electrode 110 is formed on an upper surface of the photodetector element 120 (i.e., an upper surface 113c of the second contact layer 113b). Before the second electrode 109 and the fourth electrode 110 are formed, the upper surface 104a of the second mirror 104 and the upper surface 113c of the second contact layer 113b may be washed with a plasma treatment method or the like, if necessary. By this, a device with more stable characteristics can be formed.

Then, a laminated film (not shown) of layers of, for example, titanium (Ti), platinum (Pt) and gold (Au) is formed by, for example, a vacuum deposition method. Then, portions of the laminated film other than predetermined positions are removed by a lift-off method, whereby the second electrode 109 and the fourth electrode 110 are formed. In this instance, a portion where the laminated film is not formed is formed on the upper surface 113c of the second contact layer 113b. This portion defines an aperture section 114. By this step, ohmic contact can be obtained, without conducting a heat treatment, between the second electrode 109 and the topmost layer of the second mirror 104, and between the fourth electrode 110 and the second contact layer 113b.

Then, as shown in FIG. 5, a connection electrode 117 is formed on an upper surface of the second electrode 109 and on an upper surface and side surface of the third electrode 116. First, for example, a laminated film (not shown) of layers of, for example, chrome (Cr) and gold (Au) is formed by, for example, a vacuum deposition method. Next, by using a known lift-off method, portions of the laminated film other than predetermined positions are removed, whereby the connection electrode 117 that electrically connects the second electrode 109 and the third electrode 116 is formed.

(6) Next, as shown in FIG. 1, by using the fourth electrode 110 as a mask, the second contact layer 113b is etched by wet etching until the upper surface of the etching stopper layer 115 is exposed. As the etchant that is used in this step, an etchant with which the etching stopper layer 115 is more difficult to be etched compared to the second contact layer 113b may be selected. In other words, an etchant that causes a high etching selection ratio of the second contact layer 113b with respect to the etching stopper layer 115 is selected. By this, when the second contact layer 113b is etched, it becomes easier to stop the etching at the time when the upper surface of the etching stopper layer 115 is exposed. In accordance with the present embodiment, for example, the etching stopper layer 115 may be composed of InGaP, and the second contact layer 113b may be composed of InGaAs. In this case, a mixed solution of phosphoric acid, hydrogen peroxide solution and water may be used as an etchant, whereby an etching selection ratio of the second contact layer 113b with respect to the etching stopper layer 115 can be made very high.

By the steps described above, an optical element 100 in accordance with an embodiment of the invention can be obtained, as shown in FIG. 1 and FIG. 2.

4. Before the step of etching the second contact layer 113b, the second contact layer 113b may be cut at its upper surface, or a deteriorated layer may be formed on its surface. In the manufacturing method in accordance with the present embodiment, these cut portions and deteriorated portions can be removed in the etching step. In this step, etching can be stopped at the time when the upper surface of the etching stopper layer 115 is exposed. Until this moment, the etching stopper layer 115 is covered by the second contact layer 113b. In other words, the etching stopper layer 115 would not be cut in its upper surface, or a deteriorated layer would not be formed on its surface, like the second contact layer 113b. Furthermore, because of the presence of the etching stopper layer 115, it is easy to stop etching of the second contact layer 113b at the time when its upper surface is exposed. Accordingly, in accordance with the present embodiment, the film thickness of the entire etching stopper layer 115 can be made uniform with excellent reproducibility, and the controllability over the film thickness of the photodetector element 120 including the etching stopper layer 115 can be improved.

In other words, the reflectivity of the second columnar section 132 formed from the first contact layer 111, the photoabsorption layer 112 and the etching stopper layer 115 can be made uniform with excellent reproducibility. As a result, in manufacturing the optical element 100, the uniformity and reproducibility of the device characteristics can be made favorable, and as a consequence the manufacturing yield can be made favorable.

Also, in the manufacturing method in accordance with the present embodiment, ohmic contact between the fourth electrode 110 and the second contact layer 113 can be obtained without conducting a heat treatment in the step of forming the fourth electrode 110, as described above. For example, if heat treatment is conducted, atoms composing the fourth electrode 110 may thermally diffuse, and reach, for example, the photoabsorption layer 112, whereby the device characteristics may be deteriorated. Also, the thermally diffused atoms may further diffuse during operation of the device, whereby the device characteristics may be deteriorated. In contrast, in the manufacturing method in accordance with the present embodiment, heat treatment may not have to be conducted, such that the optical element 100 in accordance with the present embodiment can maintain favorable device characteristics, and secure excellent reliability.

Also, in the present embodiment, the second contact layer 113 may be composed of $In_xGa_{1-x}As$, and the fourth electrode 110 may be composed of a film of layers of titanium (Ti), platinum (Pt) and gold (Au) laminated in this order. As a result, their contact resistance can be lowered, compared to the case where, for example, the second contact layer 113 is composed of GaAs, and the fourth electrode 110 is composed of a film of layers of an alloy of gold (Au) and zinc (Zn), and gold (Au) laminated in this order. This is because the potential barrier at an interface between $In_xGa_{1-x}As$ and titanium is lower than the potential barrier at an interface between GaAs and an alloy of gold and zinc. In order to lower the contact resistance, X in $In_xGa_{1-x}As$ may preferably be made greater.

Also, in accordance with the present embodiment, the etching stopper layer 115 may be composed of InGaP. By this, it is easier to obtain lattice matching between the etching stopper layer 115 and the photoabsorption layer 112 (GaAs layer), compared to the case where, for example, the etching stopper layer 115 is composed of InGaAs. The lattice matching state means that the lattice constants of the respective layers are identical or similar to one another to the extent that epitaxial growth takes place. By this, the etching stopper layer 115 with excellent crystallinity can be formed. As a result, the flatness of the upper surface of the etching stopper layer 115 can be improved, and the optical element 100 can have excellent device characteristics. It is noted that concrete values of the lattice constants may be, for example, as follows.

When, for example, a layer of $In_{0.49}Ga_{0.51}P$ is used as the etching stopper layer 115 in accordance with the present embodiment, its lattice constant is 0.56533 nm, which matches with the lattice constant of GaAs. In contrast, the lattice constant of $In_{0.5}Ga_{0.5}As$ is 0.58559 nm, whose lattice mismatch rate with respect to the lattice constant of GaAs is 3.58%.

5. Optical Module

Figure 6:
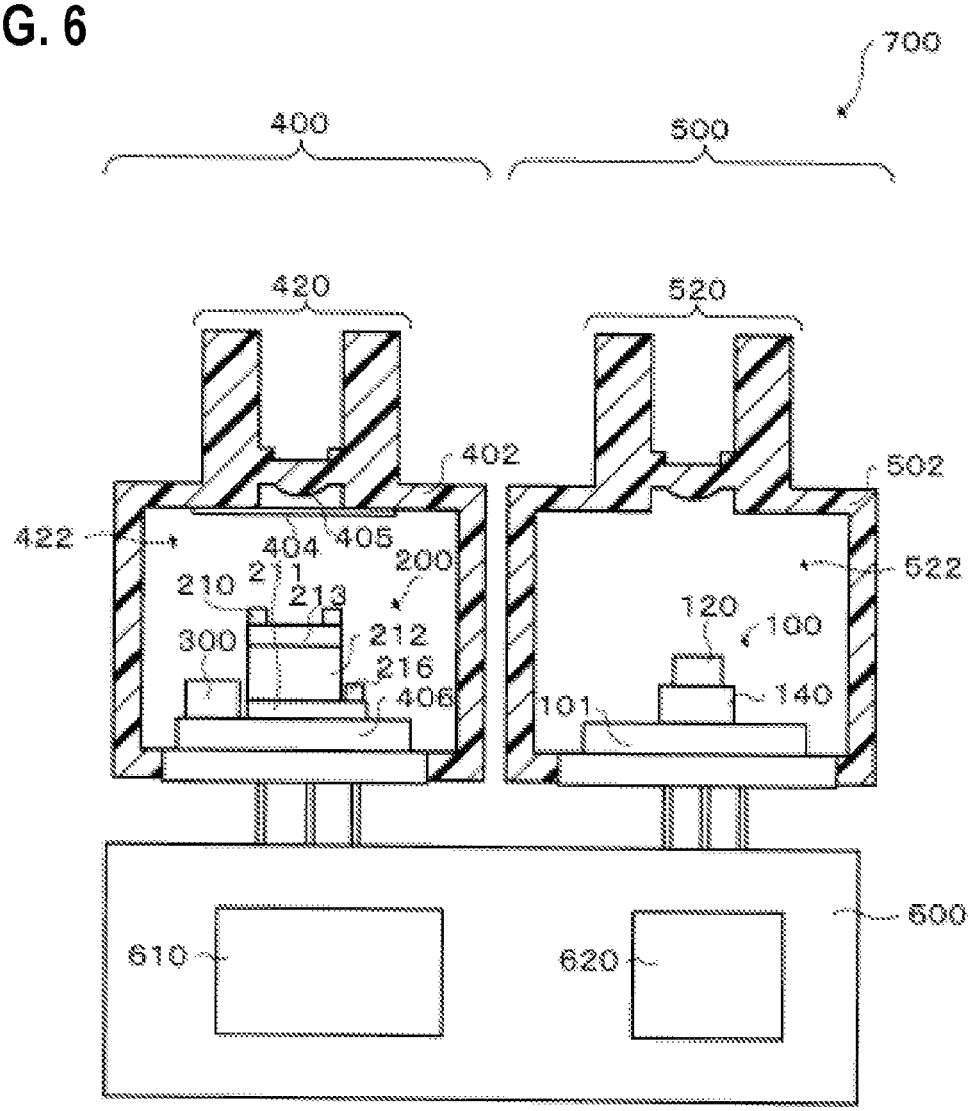
FIG. 6 schematically shows a cross-sectional view of an optical module in accordance with an embodiment of the invention.

Next, an optical module having a photoelectron integrated device in accordance with an embodiment of the invention is described with reference to FIG. 6. FIG. 6 is a schematic cross-sectional view of an optical module 700 in accordance with an embodiment of the invention. The optical module 700 shown in FIG. 6 is provided with an optical element 100 in accordance with an embodiment of the invention.

The optical module 700 includes a reception section 400, a transmission section 500, and an electronic circuit section 600. The electronic circuit section 600 includes an amplifier circuit section 610 and a drive circuit section 620.

The reception section 400 includes a substrate 406, a light receiving element 200, a preamplifier 300, a housing section 402 and a glass plate 404.

The light receiving element 200 includes a third contact layer 211, a photoabsorption layer (second photoabsorption layer) 212, a fourth contact layer 213, a fifth electrode 216, and a sixth electrode 210. The film thickness of the photoabsorption layer 212 is greater than the film thickness of the photoabsorption layer 112 of the photodetector element 120 described above. By this, the light-receiving element 200 can have higher photoabsorption efficiency, compared to the photodetector element 120. On the other hand, by reducing the film thickness of the photoabsorption layer 112, the photoabsorption efficiency of the photodetector element 120 that detects light entered from the surface-emitting type semiconductor laser 140 can be lowered. By this, the output of light emitted from the optical element 100 can be improved.

Furthermore, the diameter of the light-receiving element 200 is greater than the diameter of the second columnar section 132 composing the photodetector element 120. By this, the optical coupling efficiency of the light-receiving element 200 can be improved.

Also, a reflection prevention film may be formed on an upper surface of the fourth contact layer 213. By this, the amount of light that is reflected at a light receiving surface of the light-receiving element 200 can be reduced. On the other hand, a reflection prevention film may not preferably be provided on an upper surface of the photodetector element 120. A slight variation in the film thickness of the reflection prevention film changes the characteristics of the optical element 100, and therefore the yield of the optical element 100 can be improved by not providing a reflection prevention film on the upper surface of the photodetector element 120.

The housing section 402 is formed with, for example, a resin material, and is formed in one piece with a sleeve 420 and a focusing section 405 to be described below. Similarly, the housing section 502 is formed with a resin material, and is formed in one piece with a sleeve 520 to be described below. As the resin material, a material that is capable of transmitting light may be selected. For example, polymethyl methacrylate (PMMA) used for plastic optical fibers (POF), epoxy resin, phenol resin, diallylphthalate, phenyl methacrylate, fluorine type polymer, and the like can be used.

The sleeve 420 is formed in a manner that an optical conductive member (not shown) such as an optical fiber can be inserted from outside, and composes a portion of a circumferential wall of a storage space 422. The focusing section 405 is provided on the side of the storage space 422 of the sleeve 420, and focuses an optical signal from the light conductive member and sends out the same. By this, the loss of light from the optical conductive member can be lowered, and the optical coupling efficiency between the light receiving element 200 and the optical conductive member can be made better.

The transmission section 500 includes a sub-mount substrate 508, an optical element 100, and a housing section 502. The optical element 100 is disposed on the sub-mount substrate 508.

The surface-emitting type semiconductor laser 140 of the optical element 100 converts an electric signal inputted from outside into an optical signal, and outputs the same outside through an optical conductive member (not shown). The light receiving element 200 receives an optical signal through an optical conductive member, converts the same into an electric current, and sends the converted electric current to the preamplifier 300. The preamplifier 300 converts the received electric current to a voltage output, amplifies the same, and sends the same to the electronic circuit section 600. The amplification circuit section 610 controls the voltage output such that it does not exceed a specified level, and outputs the same outside. It is noted that descriptions of external terminals such as output terminals and input terminals for electric signals are omitted. In this manner, the optical element 100 is used in the optical module 700.

According to the optical element 100 in accordance with the present embodiment, the photodetector element 120 is provided on the surface-emitting type semiconductor laser 140, such that the optical module 700 does not require being equipped with a diagonal glass section on the side of the housing space 522 of the sleeve 520, and therefore miniaturization of the device and reduction of the cost can be realized.

6. Next, modified examples of the present embodiment are described.

6.1. First Modified Example

Figure 7:
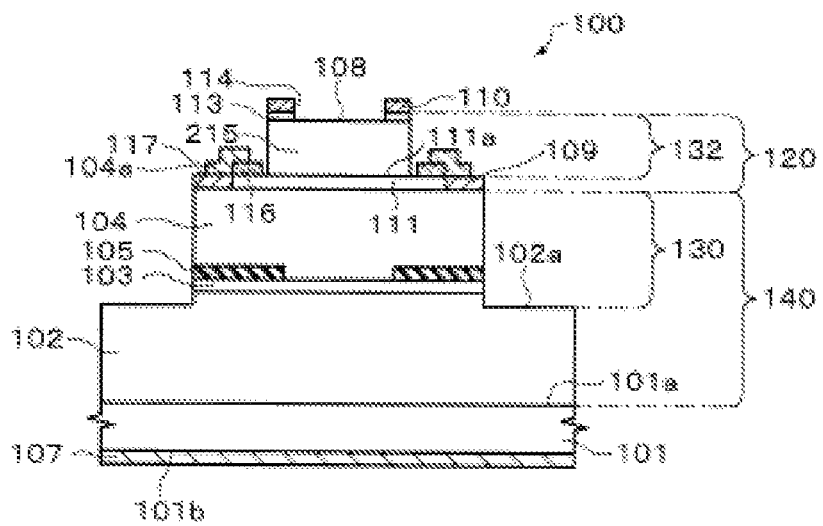
FIG. 7 schematically shows a cross-sectional view of an optical element in accordance with a first modified exemplary embodiment of the invention.

FIG. 7 is a schematic cross-sectional view of an optical element in accordance with a first modified example. In the example described above, for example, the etching stopper layer 115 is composed of InGaP, and the second contact layer 113 is composed of InGaAs. However, in the first modified example, as shown in FIG. 7, an etching stopper layer and a photoabsorption layer 215 may be made of a common layer, in other words, a layer composed of GaAs in which no impurity is doped, and a second contact layer 113 may be composed of p-type InGaP.

In the first modified example, for example, a fourth electrode 110 may be composed of a film of layers of an alloy of gold (Au) and zinc (Zn), and gold (Au) laminated in this order. In this case, in the process of forming the fourth electrode 110, the film of layers of an alloy of gold (Au) and zinc (Zn), and gold (Au) laminated in this order is patterned, and then heat treatment may be applied to the patterned film, for example, in a nitrogen atmosphere. By conducting this heat treatment, favorable ohmic contact can be obtained between the fourth electrode 110 and the second contact layer 113. The heat treatment may be conducted, for example, around 400° C. The heat treatment may be conducted for, for example, about 2 minutes.

Also, in the example described above, in the step of etching the second contact layer 113b, a mixed solution of phosphoric acid, hydrogen peroxide solution and water is used as an etchant. However, in the first modified example, a mixed solution of hydrochloric acid and water may be used. By this, the etching selection ratio of the second contact layer 113b with respect to the etching stopper layer 215 (i.e., the photoabsorption layer 215) can be made very high.

According to the first modified example, like the example described above, the film thickness of the entire etching stopper layer 215 (i.e., the photoabsorption layer 215) can be made uniform with excellent reproducibility. As a result, in manufacturing the optical element 100, the uniformity and reproducibility of the device characteristics can be made favorable, and as a consequence the manufacturing yield can be made favorable.

According to the first modified example, the etching stopper layer and the photoabsorption layer 215 can be made of a common layer. Accordingly, the process for manufacturing an optical element can be shortened, and thus the manufacturing time can be shortened.

Other details of the structure and operations of the optical element 100 in accordance with the first modified example are similar to the structure and operations of the optical element 100 of the embodiment described above, and therefore their description is omitted.

6.2. Second Modified Example

In the examples described above, for example, the etching stopper layer 115 is composed of InGaP, and the second contact layer 113 is composed of InGaAs. In the second modified example, for example, an etching stopper layer 115 may be composed of p-type InGaP, and a second contact layer 113 may be composed of p-type GaAs.

In the second modified example, like the embodiment described above, a mixed solution of phosphoric acid, hydrogen peroxide solution and water may be used as an etchant in the step of etching a second contact layer 113b. As a result, an etching selection ratio of the second contact layer 113b with respect to an etching stopper layer 115 can be made very high.

According to the second modified example, like the examples described above, the film thickness of the entire etching stopper layer 115 can be made uniform with excellent reproducibility. As a result, in manufacturing the optical element 100, the uniformity and reproducibility of the device characteristics can be made favorable, and as a consequence the manufacturing yield can be made favorable.

Other details of the structure and operations of the optical element 100 in accordance with the second modified example are similar to the structure and operations of the optical element 100 of the embodiment described above, and therefore their description is omitted.

The embodiments of the invention are described above in detail. However, those skilled in the art should readily understand that many modifications can be made without departing in substance from the novel matter and effects of the invention. Accordingly, those modified examples are also included in the scope of the invention.

For example, in the embodiments described above, interchanging the p-type and n-type characteristics of each of the semiconductor layers does not deviate from the subject matter of the invention. Also, in the optical element 100 of the embodiment described above, AlGaAs type materials are used. However, depending on the oscillation wavelength to be generated, other materials, such as, for example, AlGaInAs type, and GaInNAs type semiconductor materials can be used.

What is claimed is:

1. An optical element comprising:
    a surface-emitting type semiconductor laser; and
    a photodetector element that detects light emitted from the surface-emitting type semiconductor laser, wherein
    the surface-emitting type semiconductor laser includes a first mirror formed above a substrate, an active layer formed above the first mirror, and a second mirror formed above the active layer, and
    the photodetector element includes a photoabsorption layer formed above the second mirror, an etching stopper layer formed above the photoabsorption layer, a contact layer formed above a portion of the etching stopper layer, and an electrode formed above the contact layer.

2. An optical element according to claim 1, wherein the etching stopper layer is composed of InGaP, and the contact layer is composed of InGaAs.

3. An optical element according to claim 1, wherein the etching stopper layer is composed of InGaP, and the contact layer is composed of GaAs.

4. An optical element according to claim 1, wherein the etching stopper layer is composed of GaAs, and the contact layer is composed of InGaP.

5. An optical module comprising:

an optical element having a surface-emitting type semiconductor laser and a photodetector element that detects light emitted from the surface-emitting type semiconductor laser; and a light-receiving element that receives light from outside, wherein the surface-emitting type semiconductor laser includes a first mirror formed above a substrate, an active layer formed above the first mirror, and a second mirror formed above the active layer, the photodetector element includes a first photoabsorption layer formed above the second mirror, an etching stopper layer formed above the photoabsorption layer, a contact layer formed above a portion of the etching stopper layer, and an electrode formed above the contact layer, and the light-receiving element includes a second photoabsorption layer and an electrode.

6. An optical module according to claim 5, wherein the first photoabsorption layer has a film thickness that is smaller than a film thickness of the second photoabsorption layer.

* * * * *